United States Patent [19]
Parker

[11] Patent Number: 4,491,741
[45] Date of Patent: Jan. 1, 1985

[54] ACTIVE PULL-UP CIRCUIT

[75] Inventor: Lanny L. Parker, Mesa, Ariz.

[73] Assignee: Motorola, Inc., Schaumburg, Ill.

[21] Appl. No.: 484,749

[22] Filed: Apr. 14, 1983

[51] Int. Cl.$^3$ .................. H03K 17/22; H03K 19/003; H03K 17/687

[52] U.S. Cl. ......................... 307/200 B; 307/246; 307/450; 307/296 R; 307/577; 365/203; 365/204

[58] Field of Search ............ 307/200 B, 246, 443, 307/448, 450, 449, 463, 491, 577, 296 R, 297, 594; 365/203, 204, 226, 228

[56] References Cited

U.S. PATENT DOCUMENTS

| | | | |
|---|---|---|---|
| 3,898,477 | 8/1975 | Buchanan | 307/448 |
| 3,911,289 | 10/1975 | Takemoto | 307/451 |
| 3,970,875 | 7/1976 | Leehan | 307/448 X |
| 4,185,321 | 1/1980 | Iwahashi et al. | 365/204 |
| 4,291,393 | 9/1981 | Wilson | 365/203 |
| 4,386,284 | 5/1983 | Wacyk et al. | 307/448 X |
| 4,433,390 | 2/1984 | Carp et al. | 365/226 X |
| 4,451,907 | 5/1984 | Donoghue | 365/203 |

Primary Examiner—Larry N. Anagnos
Attorney, Agent, or Firm—Joe E. Barbee

[57] ABSTRACT

An active pull-up circuit is provided which is process compensating. The active pull-up circuit contains a voltage reference which drives a source follower. The inverting output of the source follower controls a pull-up device which is in parallel with an active pull-up device. The active pull-up device can be much smaller in size since it is now assisted by the controlled pull-up device. The controlled pull-up device is held off until the active pull-up device pulls up the bus or line connected to the active pull-up circuit to a predetermined voltage level.

5 Claims, 1 Drawing Figure

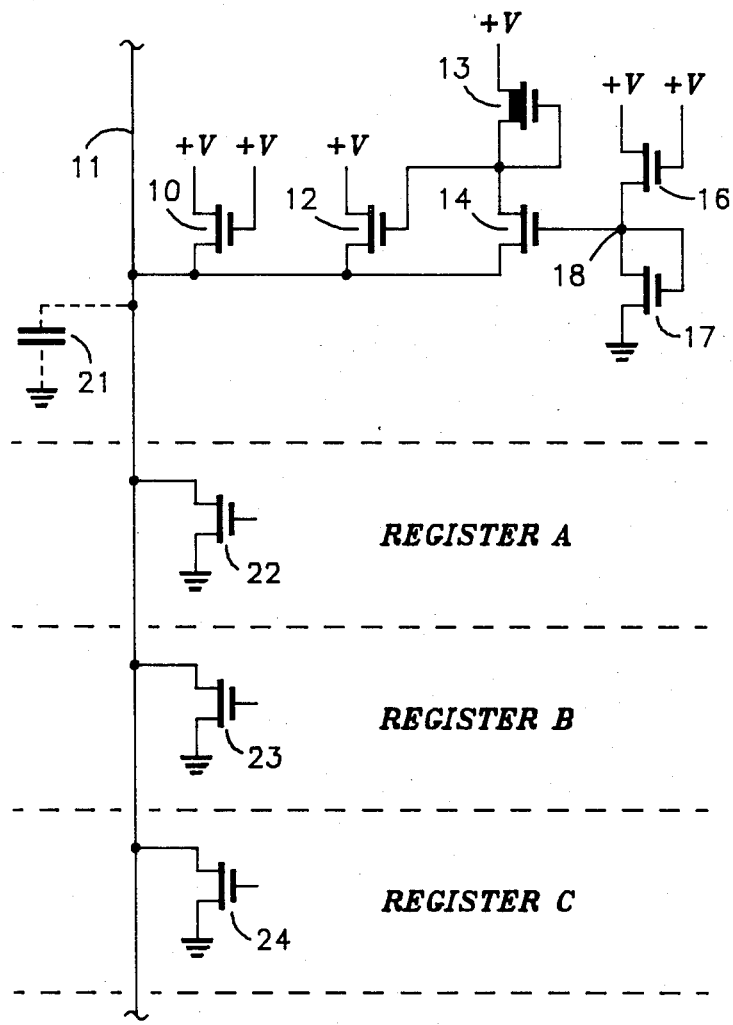

ACTIVE PULL-UP CIRCUIT

This invention relates, in general, to digital systems, and more particularly, to a digital system requiring automatic charging of certain buses or lines.

In digital systems, which are integrated on an integrated circuit chip, it is desirable to precharge or precondition certain lines or buses on the integrated circuit. This insures that the voltage level on these lines or buses are always at a predetermined amplitude or level when an operational cycle begins such as execute, read, write, fetch or the like. The control timing of many digital systems permits the precharging operation to occur at the completion of each active operational cycle. However, in some digital systems the operational control or timing of the system is such that a time slot cannot be devoted to precharging all of the buses or lines. In such a case it has been the custom to connect an active pull-up device to the line which continuously supplies current to the line. A register or other circuitry connected to the line can then pull the line to a different voltage level and in so doing must over power the active pull-up device. Since the pull-up device is not switched on and off a certain amount of current is wasted. Although the wasted current cannot be completely eliminated, without using a timing control signal, it is desirable that the amount of current used be minimized.

Accordingly, it is an object of the present invention to provide an improved active pull-up circuit and method therefor which minimizes the amount of current wasted.

Yet another object of the present invention is to provide an active pull-up circuit which provides excellent charging of bus or line capacitance under worst case speed processing parameters.

Yet a further object of the present invention is to provide an active pull-up circuit which clamps current, in order to minimize wasted current, under best case speed processing parameters while at the same time allowing better output voltage low levels to be obtained on the bus or line connected to the active pull-up circuit.

SUMMARY OF THE INVENTION

The above and other objects and advantages of the present invention are achieved by reducing the physical size of the standard active pull-up device and placing an additional pull-up device in parallel with it which modulates current. The current control is achieved on the additional pull-up device by using a voltage reference to provide a voltage reference to a source follower. The source follower provides an output to control the additional pull-up device.

The subject matter which is regarded as the present invention is set forth in the appended claims. The invention itself, however, together with further objects and advantages thereof, may be better understood by referring to the following detailed description taken in conjunction with the accompanying drawings.

BRIEF DESCRIPTION OF THE DRAWINGS

The single FIGURE illustrates in schematic form an embodiment of the present invention.

The exemplification set out herein illustrates the preferred embodiment of the invention in one form thereof, and such exemplification is not to be construed as limiting in any manner.

DESCRIPTION OF THE PREFERRED EMBODIMENT

The single FIGURE illustrates in schematic form a preferred embodiment of the present invention. Transistor 10 serves as an active pull-up device connected to a line illustrated as bus 11. The gate and drain of transistor 10 are connected to a voltage or power supply line illustrated as +V. The source of transistor 10 is connected to bus 11. Transistor 12 is connected in parallel with transistor 10 and has its drain connected to the power supply line and its source connected to bus 11. Transistors 10 and 12 are illustrated as N-channel enhancement transistors. Transistor 13 is an N-channel depletion transistor having its drain connected to the power supply line and its gate and source both connected to the gate electrode of transistor 12. Also connected to the gate of transistor 12 is the drain of N-channel enhancement transistor 14. The source of transistor 14 is connected to bus 11. The gate of transistor 14 is connected to node 18. Node 18 is a voltage reference node formed by transistors 16 and 17. Transistors 16 and 17 are illustrated as N-channel enhancement type transistors connected between the power supply line and a reference illustrated as ground. The gate and drain electrodes of transistor 16 are connected to the power supply line while the source of transistor 16 is connected to node 18. The gate and drain of transistor 17 are both connected to node 18 while the source of transistor 17 is connected to ground.

The single FIGURE illustrates a portion of a digital system such as can be found in a microprocessor. Bus 11 is only one conductor of many that would be required in a typical microprocessor. As an example, an 8-bit bus would have eight lines or buses 11 whereas a 16 or 32-bit microprocessor would have sixteen or thirty two such lines, respectively. Three registers, Register A, Register B, and Register C are shown connected to bus 11; however, it will be understood that a typical microprocessor system would contain many such registers connected to the bus. Transistor 22 serves as the output device for Register A and has its drain connected to bus 11 and a source connected to ground. Transistor 23 represents the output transistor for Register B and has its drain connected to bus 11 and its source connected to ground. Transistor 24 represents the output of Register C and has its drain connected to bus 11 and its source connected to ground. It will also be understood that there are many input devices connected to bus 11 and these input devices would typically have their gate electrodes connected to bus 11. These input devices are not illustrated since the capacitance loading of these devices on bus 11 is much less than the capacitve loading provided by transistors 22, 23 and 24. Capacitor 21, shown in phantom, has one electrode connected to bus 11 and the other electrode connected to ground. Capacitor 21 represents the metal line capacitance of bus 11 and the capacitance of the devices that are connected to bus 11. The bus arrangement illustrated is typically referred to as the NOR gate approach for bus or line control since the bus serves as the distributed output of the NOR gate and the register serves as the switching device. The active pull-up circuit, comprising, transistors 10, 12, 13, 14, 16 and 17, serves as the load device for the resulting NOR gate operation.

The operation of the active pull-up circuit will now be explained. Transistors 16 and 17 provide a voltage reference which can vary over a volt due to process parameter and temperature variations. With the worst case speed process parameter the voltage reference available at node 18 will be approximately 3 volts. If in such a case, bus 11 is pulled low, transistor 14 is enabled, and the current supplied by transistor 13 is channeled to ground through the pull-down device which pulls bus 11 low. When the pull-down on bus 11 is turned off, pull-up device 10 will commence charging bus capacitance 21. As the voltage on the source of transistor 14 commences to increase, transistor 14 will decrease conduction until it turns off, which occurs when its source reaches one threshold level below the reference voltage appearing at node 18. Transistor 13 can now pull the gate of transistor 12 high causing transistor 12 to conduct to provide two devices, transistors 10 and 12 in parallel charging the capacitance of bus 11. Previous digital systems only had transistor 10 which was much larger in physical size than the present transistor 10.

Should the processing of an integrated circuit chip containing the present invention be the maximum power parameters, the voltage reference at node 18 will approach approximately 4.2 volts. Now when bus 11 is pulled low transistor 14 will be enabled thereby pulling the gate electrode of transistor 12 low thus keeping transistor 12 turned off. Since transistor 10 is smaller than transistor 12, the pull-down device that is pulling down on bus 11 can maintain bus 11 at a low output level. When bus 11 is released transistor 10 will again start the charging of bus capacitor 21. The higher voltage provided by the voltage reference circuit at node 18 will cause transistor 14 to be held on longer preventing pull-up transistor 12 from becoming active until the bus has been significantly charged by transistor 10. This keeps the maximum current at a lower level which results in less wasted current.

Transistor 13 is a heavy depletion transistor, which provides a higher voltage at the gate of transistor 12. This higher voltage on the gate of transistor 12 causes transistor 12 to turn on faster thereby pulling bus 11 up faster once transistor 14 turns off.

By now it should be appreciated that there has been provided a process compensating active pull-up circuit useful in bus structures particularly in VLSI microprocessor circuits that transfer data on a bus during each timing cycle. The new active pull-up circuit provides excellent charging of bus capacitance in the worst case speed processing parameters. Yet this same circuitry clamps current under best case speed processing parameters allowing better output voltage low ($V_{OL}$) levels on the bus or line.

Consequently, while in accordance with the Patent Statutes there has been described what at present is considered to be the preferred form of the invention. It will be obvious to those skilled in the art that numerous changes and modifications may be made herein without departing from the spirit and scope of the invention, and it is therefore intended in the following claims to cover all such modifications.

I claim:
1. An active pull-up circuit comprising: a voltage reference circuit for providing an output reference voltage; a source follower coupled between the voltage reference circuit and an output node so that the output of the voltage reference circuit controllably varies an inverting output of the source follower; a first pull-up transistor coupled between a power supply terminal and the output node and having a control electrode coupled to the inverting output of the source follower, the output node providing the output for the active pull-up circuit.

2. The active pull-up circuit of claim 1, further including a second pull-up transistor coupled in parallel with the first pull-up transistor, the second pull-up transistor being connected in a diode configuration.

3. The active pull-up circuit of claim 1 wherein the source follower is an inverter coupled between the power supply terminal and the output node and has its inverting output coupled to the control electrode of the first pull-up transistor.

4. An active pull-up for a microprocessor bus structure, comprising: a diode connected transistor coupled between a power supply terminal and the bus structure; a first transistor coupled in parallel with the diode connected transistor and having a control electrode; a second transistor coupled between the power supply terminal and the control electrode of the first transistor, the second transistor having a control electrode coupled to the control electrode of the first transistor; a third transistor coupled between the control electrode of the first transistor and the bus structure; a fourth and a fifth transistor connected in series to form a voltage reference and providing a reference voltage output, the reference voltage output being coupled to a control electrode of the third transistor.

5. The active pull-up of claim 4 wherein the second transistor is a depletion type transistor and the remaining transistors are enhancement type transistors.

* * * * *